(12) United States Patent
Lee et al.

(10) Patent No.: US 6,933,063 B2
(45) Date of Patent: Aug. 23, 2005

(54) SPIROBIFLUORENE COMPOUNDS, ELECTROLUMINESCENCE POLYMER AND ELECTROLUMINESCENCE ELEMENT HAVING THE SAME

(75) Inventors: Jeong Ik Lee, Suwon (KR); Hyoyoung Lee, Taejon (KR); Jiyoung Oh, Taejon (KR); Hye Yong Chu, Taejon (KR); Lee-Mi Do, Taejon (KR); Seong Hyun Kim, Taejon (KR); Taehyoung Zyung, Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/007,169

(22) Filed: Nov. 30, 2001

(65) Prior Publication Data

US 2003/0044641 A1 Mar. 6, 2003

(30) Foreign Application Priority Data

Jul. 21, 2001 (KR) ........................... 2001-44057

(51) Int. Cl.$^7$ .................. H05B 33/14; C08G 61/10; C07C 43/03
(52) U.S. Cl. .................. 428/690; 428/917; 313/504; 257/40; 528/8; 528/394; 528/425; 568/3; 568/607; 568/626; 570/183
(58) Field of Search ................... 428/690, 917; 313/504, 506; 257/40, 103; 252/301.16, 301.35; 528/8, 394, 397, 425; 526/239, 280; 568/1, 3, 607, 626; 570/183

(56) References Cited

U.S. PATENT DOCUMENTS 5,621,131 A * 4/1997 Kreuder et al. ............. 558/46
5,763,636 A * 6/1998 Kreuder et al. ............. 528/46
6,132,641 A * 10/2000 Rietz et al. ............ 252/301.16
2003/0111107 A1 * 6/2003 Salbeck et al. ............ 136/256

FOREIGN PATENT DOCUMENTS

KR 2002-0068737 A 8/2002

OTHER PUBLICATIONS

In–Nam Kang, et al., Highly Improved Quantum Efficiency in Blend Polymer LED's, *Macromolecules* 1996, 29, 165–169.

Taek Ahn, et al., Blue Electroluminescent Polymers: Control of Conjugation Length by Kink Linkages and Substituents in the Poly(p–phenylenevinylene)–Related Copolymers, *Micromolecules* 1999, 32, 3279–3285.

\* cited by examiner

*Primary Examiner*—Marie Yamnitzky
(74) *Attorney, Agent, or Firm*—Blakely Sokoloff Taylor & Zafman

(57) ABSTRACT

Provided are spirobifluorene compounds which can provide excellent processibility with improved solubility in organic solvents, an electroluminescence (EL) polymer obtained therefrom and an EL element having the same. The EL polymer comprising repeating units of the following formula:

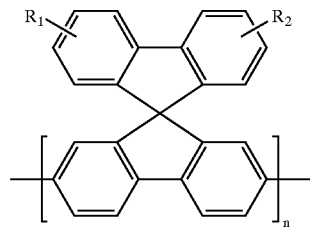

wherein $R_1$ and $R_2$ are identical or different and are independently a straight-chain or branched alkyl group having from 1 to 22 carbon atoms or an aryl group substituted by $C_1$–$C_{22}$ alkyl, and at least one of the $R_1$ and $R_2$ contains one or more atoms selected from the group consisting of O, N, S, Si and Ge.

8 Claims, 4 Drawing Sheets

SPIROBIFLUORENE COMPOUNDS, ELECTROLUMINESCENCE POLYMER AND ELECTROLUMINESCENCE ELEMENT HAVING THE SAME

BACKGROUND OF THE INVENTION

1. Field of the Invention

The present invention relates to an electroluminescence (EL) polymer and an EL element having the same, and more particularly, to spirobifluorene compounds which can provide excellent processibility with improved solubility in organic solvents, an EL polymer obtained therefrom and an EL element having the same.

2. Description of the Related Art

In general, an electroluminescence (EL) element using polymer materials is formed by sequentially depositing a transparent electrode, an electrically conducting buffer layer, a light-emitting polymer layer, a dielectric layer and a metal electrode on a substrate. Here, if the transparent electrode and the metal electrode are connected to positive (+) and negative (−) terminals of power, holes are supplied to the light-emitting polymer layer through the transparent electrode and electrons are supplied to the light-emitting polymer layer through the metal electrode. The holes and electrons supplied to the light-emitting polymer layer are combined therein to create exciton. Upon deactivation of the excitation to a ground state, light corresponding to a band gap of the light-emitting polymer is emitted, thereby achieving luminescence. The color of the emitted light can be varied according to the band gap of the light-emitting polymer.

Since organic EL elements are quick in response and self-illuminating, they require no additional back light source. Also, the organic EL elements have excellent luminance and are not dependent upon viewing angle of display. Types of the organic EL elements include low molecular weight EL elements and polymer EL elements according to materials used. The polymer EL elements can be fabricated through solution process while the low molecular weight EL elements are usually prepared through vacuum deposition process, those have excellent processability and their operating voltage is low, that is, power consumption is small.

Since Cambridge group first found and disclosed in 1990 that light is emitted from poly(1,4-phenylenevinylene), which is a conjugated double bond polymer, as a voltage is applied, the field of EL polymer has been greatly advanced in terms of materials and devices. Covion Organic Semiconductors GmbH, based in Germany, developed poly(1,4-phenylenevinylene) based polymer materials soluble in organic solvents and having good chemical stability and light-emitting efficiency. The Dow Chemical Company (USA) developed poly(fluorene) based polymer materials having better chemical stability and light-emitting efficiency than poly(1,4-phenylenevinylene) based polymer materials.

Poly(phenylene)-, specifically, poly(fluorene)-based materials are known as promising blue light-emitting materials. Woo, Inbasekaran, Shiang and Roof developed EL polymers using a polymerization technique of polymers, called Suzuki coupling, and disclosed poly(fluorene) based EL materials in WO 97/05184 in 1997. In 1999, poly(fluorenes) with polar side chains were proposed by Pei, Yu and Yang, but the polar side chains promote formation of excimer, which is one of problems with poly(fluorene), resulting in degradation in color purity (see U.S. Pat. No. 5,900,327 and J. Appl. Phys., Vol. 81, pp 3294–3298). Use of the proposed polymers allowed manufacture of light-emitting electrochemical cells using polar side chains, with a very high efficiency of light emission. In order to solve the problem of degradation in color purity of blue electoluminescence due to formation of excimer by conventional poly(fluorenes), Chen, Klaerner, Miller and Scott of IBM Corporation developed poly(anthracene-co-fluorene) copolymers obtained by copolymerizing the poly(fluorenes) with anthracenes (see U.S. Pat. No. 5,998,045). It is quite important for blue light-emitting polymers to exhibit high efficiency of light emission while maintaining color purity.

In order to improve color purity of poly(fluorenes), Kreuder, Lupo, Salbeck, Schenk and Stehlin disclosed poly(spirobifluorenes) having a spiro framework and copolymers thereof (see U.S. Pat. No. 5,621,131). Also, they disclosed polymer EL materials using new spiro polymers having a Spiro framework other than spirobifluorene or having a hetero element substituted (see U.S. Pat. Nos. 5,763,636 and 5,859,211). Although these materials have high color purity and color stability, they are poor in view of processibility, that is, poor polymer film forming properties due to low solubility in organic solvents.

SUMMARY OF THE INVENTION

To solve the above-described problems, it is a first object of the present invention to provide spirobifluorene compounds configured to provide EL polymers having improved polymer processibility while maintaining high color purity and color stability, to be used to prepare EL polymers forming light-emitting layers of EL elements.

It is a second object of the present invention to provide EL polymers having improved solubility in organic solvents to increase polymer processibility while maintaining high color purity and color stability.

It is a third object of the present invention to provide EL elements having EL polymer layers containing the EL polymers.

To accomplish the first object, the present invention provides a compound defined by the following formula:

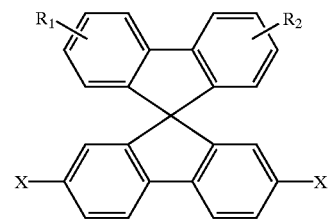

wherein $R_1$ and $R_2$ are identical or different and are independently a straight-chain or branched alkyl group having from 1 to 22 carbon atoms or an aryl group substituted by $C_1$–$C_{22}$ alkyl, and at least one of the $R_1$ and $R_2$ contains one or more atoms selected from the group consisting of O, N, S, Si and Ge, and X is halogen, boric acid or boric ester. Preferably, at least one of the $R_1$ and $R_2$ is a polar group containing an ether bond. Also, at least one of the $R_1$ and $R_2$ may contain 2 to 5 oxygen atoms forming an ether bond on every two carbons.

To accomplish the second object, there is provided an electroluminescence (EL) polymer comprising repeating units of the following formula:

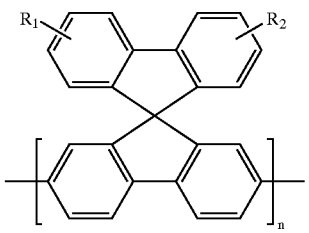

wherein $R_1$ and $R_2$ are identical or different and are independently a straight-chain or branched alkyl group having from 1 to 22 carbon atoms or an aryl group substituted by $C_1$–$C_{22}$ alkyl, and at least one of the $R_1$ and $R_2$ contains one or more atoms selected from the group consisting of O, N, S, Si and Ge. Preferably, at least one of the $R_1$ and $R_2$ is a polar group containing an ether bond. Also, at least one of the $R_1$ and $R_2$ may contain 2 to 5 oxygen atoms forming an ether bond on every two carbons. The $R_1$ and $R_2$ are preferably at positions 3' and 6' or at positions 1' and 6', respectively. Further, at least one of the $R_1$ and $R_2$ is preferably 3,6-dioxaheptyloxy or 3,6,9-trioxadecyloxy. In the EL polymer according to a preferred embodiment of the present invention, n is an integer from 3 to 10,000.

To accomplish the third object, there is provided an electroluminescence element comprising a cathode, an anode, and a light-emitting layer interposed between the cathode and the anode and containing the EL polymer as defined above.

According to the present invention, the EL polymers having improved solubility in organic solvents while maintaining high color purity and color stability of poly (spirobifluorenes). Therefore, highly efficient EL elements can be attained by forming light-emitting polymer layers thereof using the EL polymers according to the present invention.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
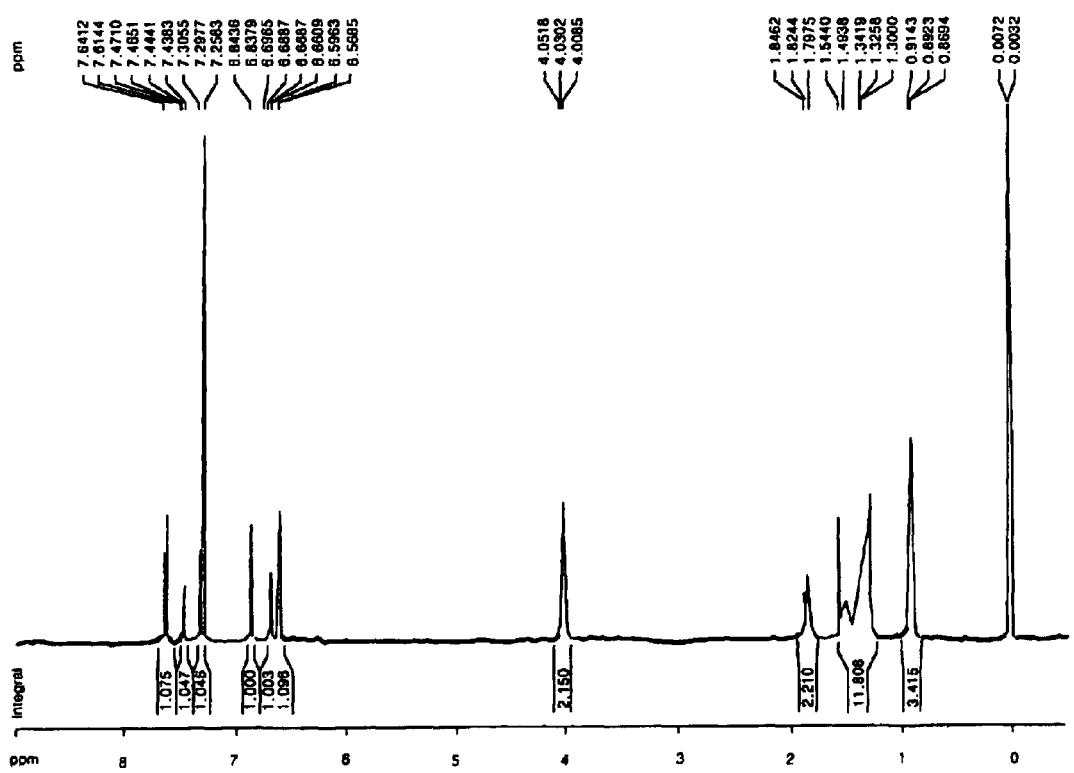
FIG. 1 is a nuclear magnetic resonance (NMR) spectrum of a compound V-1 prepared in Example 5.

Spirobifluorene compounds according to the present invention can be prepared by a synthesis method represented by the reaction scheme 1:

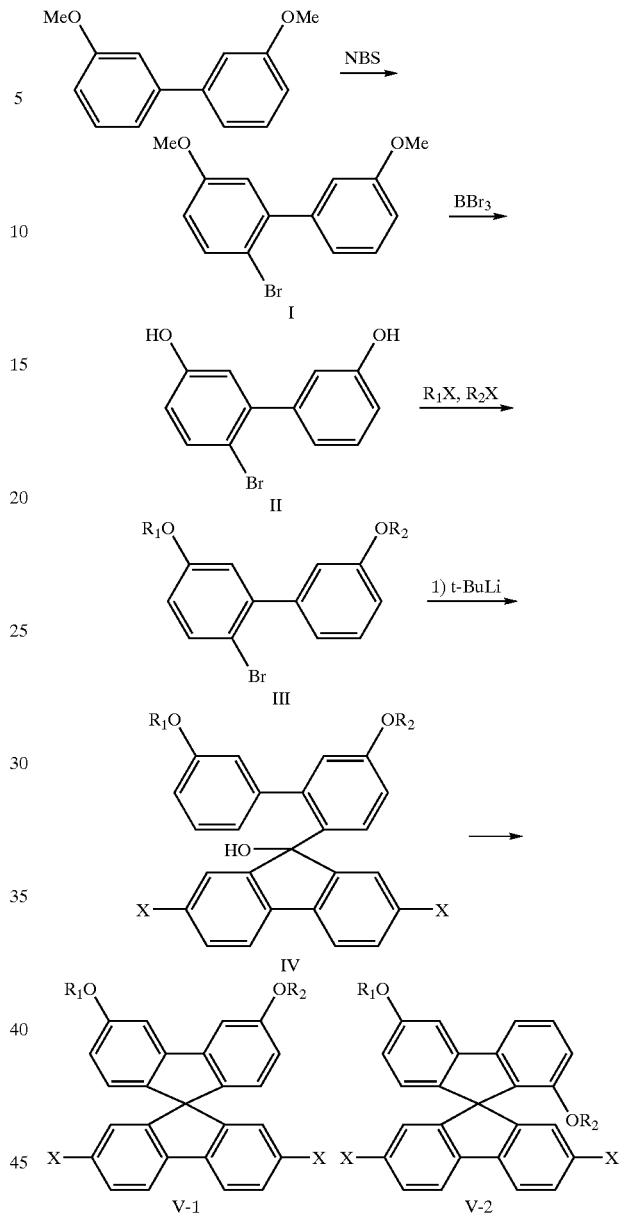

An EL polymer containing spirobifluorene monomer having a side chain according to the present invention can be prepared by polymerizing a monomer such as the compound V-1 or V-2 obtained by the reaction scheme 1 or by copolymerizing the monomer with another monomer having two aryl halides. Copolymerization to give the EL polymer according to the present invention is possible by two methods.

First, only the monomers having halogen functional groups are used.

Second, a monomer having a halogen functional group is reacted with a monomer having a boric acid or boric ester functional group for copolymerization. These two methods can both be advantageously used for preparation of the EL polymer according to the present invention.

EXAMPLE 1

Preparation of 2-bromo-5,3'-dimethoxybiphenyl 3,3'-dimethoxybiphenyl (5.0 g, 23.34 mmol) was dissolved in a dimethylformamide solvent and cooled to 0° C.

N-bromosuccinimide (4.15 g, 23.34 mmol) was dissolved in a dimethylformamide solvent (63 ml) and added slowly to a solution of 3,3'-dimethoxybiphenyl for about 1.5 hours. The mixture was stirred at room temperature for about 12 hours and distilled water was added thereto, followed by stirring for about 10 minutes. The resultant was filtered three times with hexane and the filtrate was washed three times with distilled water and dried over sodium sulfate. Hexane was removed under reduced pressure to obtain a desired product (Yield: 6.70 g (98%)). The obtained product was identified as 2-bromo-5,3'-dimethoxybiphenyl through the nuclear magnetic resonance (NMR) spectrum, corresponding to the compound I of the reaction scheme 1.

EXAMPLE 2

Preparation of 6-bromo-biphenyl-3,3'-diol

A solution of boron tribromide (137 ml, 1M, 137.12 mmol dissolved in dichloromethane) was slowly added to the compound I (6.70 g, 22.85 mmol) prepared in Example 1 at 0° C., followed by stirring for 1 hour. The stirred solution was allowed to warm to room temperature and continuously stirred for about 12 hours. A small amount of ice water was slowly added to the reactant mixture, followed by filtering three times with dichloromethane, washing three times with distilled water, drying with sodium sulfate. Then, the dichloromethane solvent was removed under reduced pressure to obtain a residual product. Purification by silica gel chromatography using 4% ethyl acetate in dichloromethane gave 6-bromo-biphenyl-3,3'-diol corresponding to the compound II of the reaction scheme 1 (Yield: 5.92 g, 98%). The product was identified through the NMR spectrum that it had the identical structure with the compound II.

EXAMPLE 3

Preparation of 2-bromo-5,3'-bis-octyloxy-biphenyl 6-bromo-biphenyl-3,3'-diol (5.92 g, 22.43 mmol) prepared in Example 2, 1-octylbromide, potassium carbonate (18.60 g, 134.56 mmol) and potassium iodide (3.72 g, 22.43 mmol) were dissolved in dimethylformamide (60 ml), followed by heating for about 24 hours at about 150° C. After cooling to room temperature, distilled water was added to the resultant and stirred for about 10 minutes, followed by filtering three times with hexane, washing three times with distilled water, drying with sodium sulfate. Then, the hexane was concentrated under reduced pressure. Purification by silica gel chromatography using 4% dichloromethane in hexane gave 2-bromo-5,3'-bis-octyloxy-biphenyl corresponding to the compound III of the reaction scheme 1 (Yield: 6.36 g, 58.1%), $R_1$ and $R_2$ in the formula of the compound III being each independently octyl. The product was identified through the NMR spectrum and element analysis that it had the identical structure with the compound III.

EXAMPLE 4

Preparation of 9-(5,4'-bis-octyloxy-biphenyl-2-yl)-2,7-dibromo-9H-fluoren-9-ol 2-bromo-5,3'-bis-octyloxy-biphenyl (0.598 g, 1.225 mmol) prepared in Example 3 was dissolved in dried THF (30 ml) and cooled to −78° C. Then, 5-butyllithium (t-BuLi) (1.7M, 1.44 ml, 2.45 mmol) was added slowly. The obtained resultant was stirred for about 1 hour at −78° C. After 1 hour, 2,7-dibromofluoren-9-on (0.497 g, 1.47 mmol) dissolved in dried THF (20 ml) was added slowly, stirred for about 1 hour, allowed to warm to room temperature and further stirred at room temperature for about 30 minutes. A small amount of distilled water was added to complete the reaction and saturated brine was added to the resultant. The organic layer was filtered twice with ether and dried over sulfate, and the ether was concentrated under reduced pressure. Purification by silica gel chromatography using 30 to 40% dichloromethane in hexane gave 9-(5,4'-bis-octyloxy-biphenyl-2-yl)-2,7-dibromo-9H-fluorene-9-ol corresponding to the compound IV of the reaction scheme 1 (Yield: 0.62 g, 68%), $R_1$ and $R_2$ in the formula of the compound IV being each independently octyl and X being boron. The product was identified through the NMR spectrum and element analysis that it had the identical structure with the compound IV.

EXAMPLE 5

Preparation of 2,7-dibromo-3',6'-bisoctyloxy-9,9'-spirobisfluorene and 2,7-dibromo-1',6'-bisoctyloxy-9,9'-spirobisfluorene The compound prepared in Example 4 (0.5 g, 0.668 mmol) was mixed with polyphosphate (6 ml) and stirred for about 24 hours at 60° C. After cooling to room temperature, a small amount of distilled water was added to complete the reaction, followed by filtering the organic layer twice with dichloromethane, drying with sodium sulfate, and then the dichloromethane was concentrated under reduced pressure. Purification by silica gel chromatography using 4% dichloromethane in hexane gave 2,7-dibromo-3',6'-bisoctyloxy-9,9'-spirobisfluorene corresponding to the compound V-1 of the reaction scheme 1 (Yield: 0.24 g, 49%), $R_1$, $R_2$ and X in the formula of the compound V-1 being the same as defined in Example 4. In the same manner, 2,7-dibromo-1',6'-bisoctyloxy-9,9'-spirobisfluorene, which is a geometric isomer of the compound V-1, corresponding to the compound V-2 of the reaction scheme 1 (Yield: 0.24 g, 49%), $R_1$, $R_2$ and X in the formula of the compound V-1 being the same as defined in Example 4.

Figure 2:
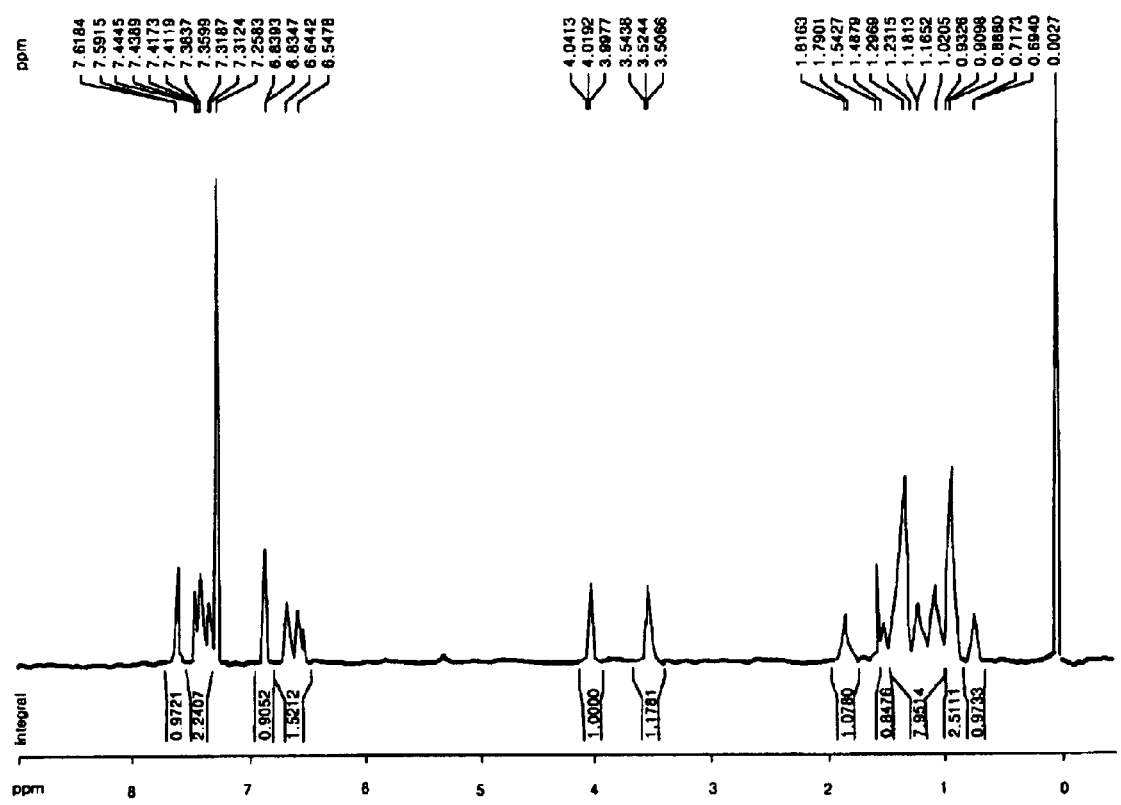
FIG. 2 is a nuclear magnetic resonance (NMR) spectrum of a compound V-2 prepared in Example 5.

FIGS. 1 and 2 show the NMR spectra of the obtained products, that is, 2,7-dibromo-3',6'-bisoctyloxy-9,9'-spirobisfluorene (the compound V-1) and 2,7-dibromo-1',6'-bisoctyloxy-9,9'-spirobisfluorene (the compound V-2).

EXAMPLE 6

Preparation of poly(spirobifluorene) EL Polymer

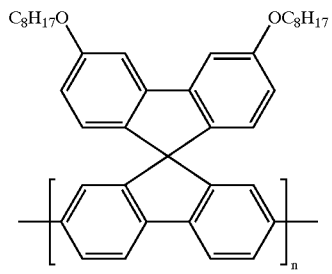

Ni(cod)$_2$ (730 mg, 2.7 mmol) and 2,2-dipyridyl (450 mg, 2.9 mmol) were placed in a Schlenk flask, and toluene (6 ml) and dimethylformamide (6 ml) were added thereto. 1,5-cyclooctadiene (0.2 ml) was added to the reactant and reacted at 80° C. for about 30 minutes. The monomer (1.14 g, 1.5 mmol) prepared in Example 5 was dissolved in toluene (6 ml) and put into the flask for polymerization for about 48 hours. After 9-bromoanthracen (50 mg) was dissolved in toluene (3 ml) and added to the flask, the resulting solution was further reacted for about 12 hours. To a flask containing a mixture of acetone, methanol and conc. hydrochloric acid (each 150 ml) was added the reactant solution with stirring, and the resultant was further stirred for about 12 hours. The obtained polymer was reprecipitated several times using a mixed solvent of acetone and methanol in the same amount (1:1), and the precipitate was dried under vacuum to yield a desired polymer (Yield: 0.45 g, 50%). The obtained polymer was dissolved well in organic solvents such as THF, CHCl$_3$, xylene, chlorobenzene and so on, and had excellent film-forming properties. The number average molecular weight (Mn) of the polymer was 50,000 (as measured by GPC, polystyrene standard).

EXAMPLE 7

Photoluminescence (PL) Measurement

Figure 3:
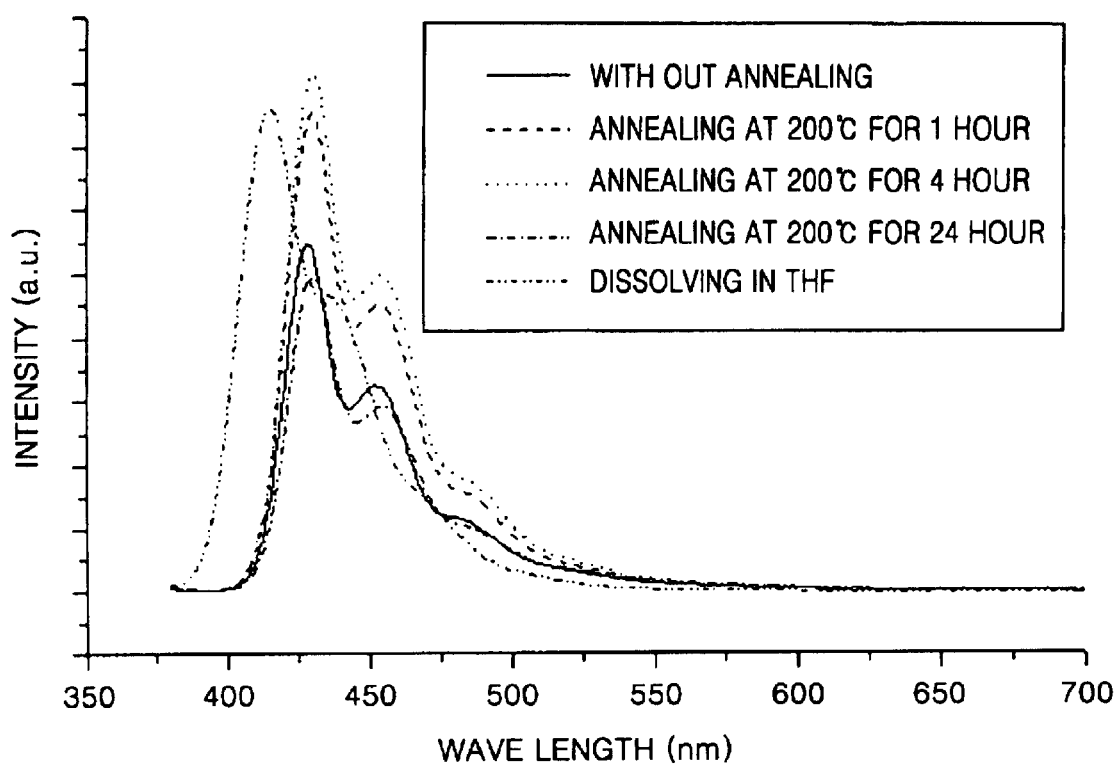
FIG. 3 is a graph depicting the photoluminescence (PL) spectrum for EL polymers prepared in Example 6 treated under various annealing time conditions and dissolved in a solution of THF.

The polymer prepared in Example 6 was dissolved in p-xylene at a concentration of 5 mg/ml and spin-coated on a quartz substrate at a rate of 1,000 rpm. To observe a change in the color of light emitted with annealing, annealing was carried out at 200° C. under inert gas atmosphere, e.g., nitrogen. In order to examine annealing time dependency, the annealing time was varied to 1 hour, 4 hours and 24 hours. To investigate PL spectra of the polymer in the solution, the polymer was dissolved in THF to prepare samples (<10$^{-5}$ mol/l). The PL spectra were measured by a SPEX Fluorolog-2 spectrometer with an excitation wavelength of 380 nm. FIG. 3 shows the photoluminescence spectra of the respective samples. The respective samples displayed blue emission with very high PL levels, high color purity. Also, the result showed that the PL spectra were little affected by annealing time.

EXAMPLE 8

Manufacture of EL Element

Figure 4:
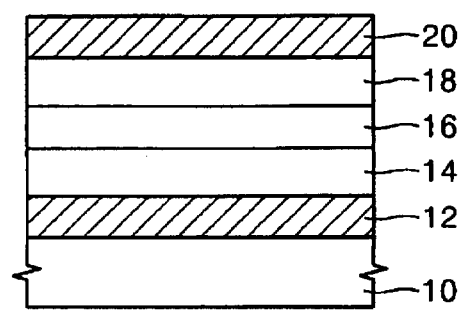
FIG. 4 is a cross-sectional view illustrating a method of manufacturing EL elements according to the present invention.

The EL element was manufactured using the EL polymer prepared in Example 6, which will now be described in detail with reference to FIG. 4. A glass substrate 10 having a transparent electrode 12 made of indium tin oxide (ITO) patterned thereon was cleaned, and then an electrically conducting polymer Baytron P 4083 supplied by Bayer Corporation was coated to a thickness of about 30 nm to form a buffer layer 14. Then, the resultant was dried at a vacuum oven maintained at 100° C. for about 2 hours. A solution of EL polymer dissolved in p-xylene was filtered using a 0.2 mm filter and spin-coated on the buffer layer 14 to a thickness of 100 nm to form an EL polymer layer 16. The resultant was dried at a vacuum oven maintained at 100° C. for about 2 hours. A dielectric layer 18 and a metal electrode layer 20 were deposited on the EL polymer layer 16 under a pressure of 10$^{-6}$ torr or less by means of vacuum deposition. The dielectric layer 18 was formed of LiF and the metal electrode layer 20 was formed of Al. The emission area of the EL element was 4 mm$^2$.

While the invention has been described in terms of specific examples, various changes and modifications can be made. For example, the substrate 10 may be formed of not only glass but also polycarbonate, polyimide, polyethyleneterephthalate or polyethylenenaphthalate. Also, the transparent electrode 12 may be formed of indium tin oxide, tin oxide, zinc oxide or combinations thereof. The transparent electrode 12 may be formed by mixing these exemplary materials in an appropriate ratio according to the requirements in view of transmissivity and conductivity, using a sputtering method. The buffer layer 14 is formed of, for example, polythiopene or polyaniline for the purpose of improving interface characteristics between the transparent electrode 12 and the EL polymer layer 16. The dielectric layer 18 can be formed of metal oxides such as MgO or Li$_2$O, fluorine compounds such as LiF, as a thin film having a thickness of 10 nm or less.

EXAMPLE 9

Electroluminescence Evaluation

Figure 5:
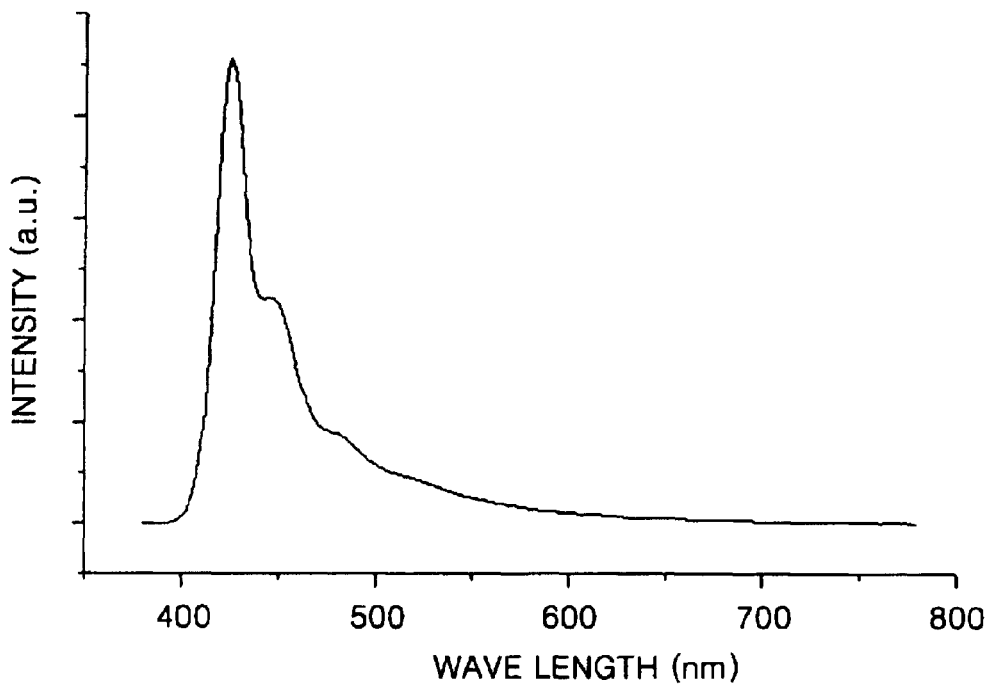
FIG. 5 is a graph depicting the electroluminescence (EL) spectrum of an EL element prepared in Example 8.

The electroluminescent characteristics of the EL element prepared in Example 8 were evaluated. FIG. 5 depicts the EL spectrum based on the evaluation result. In FIG. 5, the emission maximum is 425 nm, and blue emission is exhibited between 400 and 500 nm. The CIE color coordinate of the emission is (0.17, 0.10), that is, blue emission with high color purity.

Figure 6:
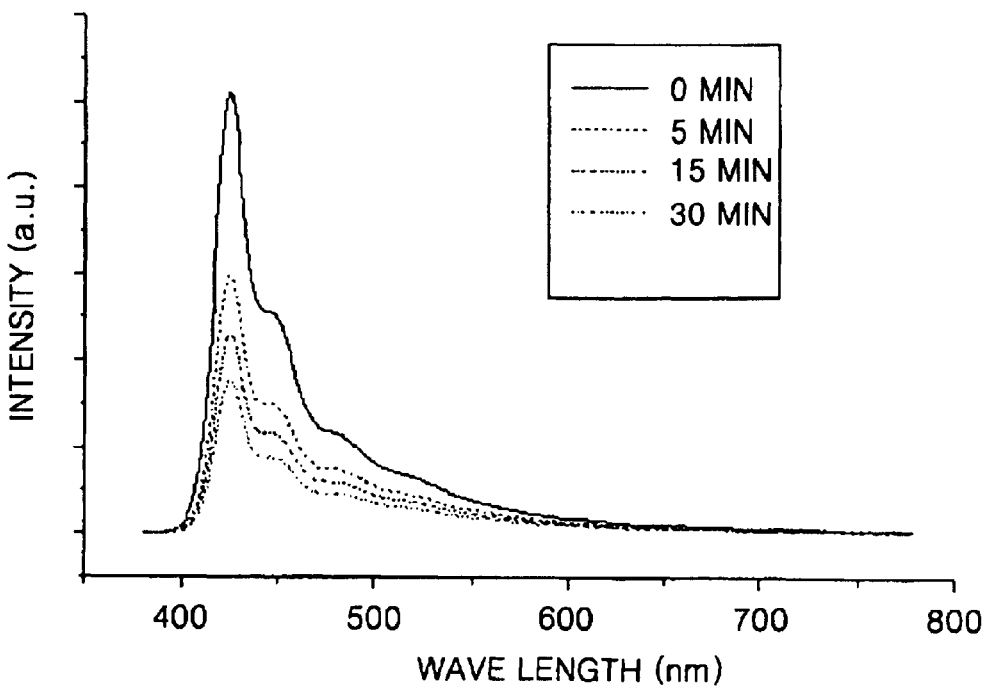
FIG. 6 is a graph depicting the EL spectrum depending on the driving time of the EL element prepared in Example 8.

In order to examine color stability of the EL element manufactured in Example 8, a change in EL spectrum over driving time was observed, and the result is shown in FIG. 6. As shown in FIG. 6, it was confirmed that little change was affected by the driving time of the EL element, that is, the EL element had high color purity.

The EL element according to the present invention is manufactured by polymerizing a single monomer formed of a spirobifluorene compound having a side chain with high solubility in organic solvents or by copolymerizing the monomer with another monomer having aryl halides. Thus, the EL element according to the present invention has excellent color purity and color stability. Also, since the EL element according to the present invention has good solubility in organic solvents, its processibility is high. Further, the EL polymers according to the present invention has properties good enough to meet requirements as electronic materials, including transmissivity, environment resistance, adhesive strength with respect to a substrate, film-forming property, electric field stability and so on. Therefore, a highly efficiency EL element can be attained by use of the EL polymer according to the present invention in forming a light-emitting layer of the EL element.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A compound having a fully conjugated main chain between two Xs and defined by the following formula:

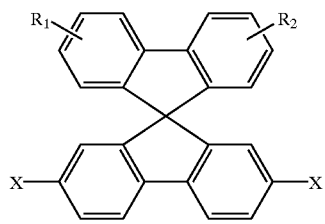

wherein

R$_1$ and R$_2$ are identical or different and are independently a straight-chain or branched alkyl group having from 1 to 22 carbon atoms wherein the alkyl group may contain one or more oxygen atoms, provided at least one of R$_1$ and R$_2$ is a polar group containing an ether bond, and X is halogen, boric acid or boric ester.

2. The compound of claim 1, wherein at least one of the R$_1$ and R$_2$ contains 2 to 5 oxygen atoms forming an ether bond on every two carbons.

3. An electroluminescence (EL) polymer having a fully conjugated main chain comprising repeating units of the following formula:

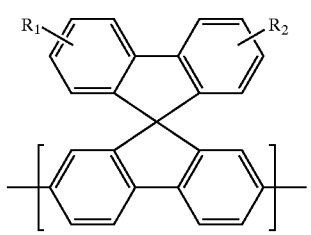

wherein $R_1$ and $R_2$ are identical or different and are independently a straight-chain or branched alkyl group having from 1 to 22 carbon atoms wherein the alkyl group may contain one or more oxygen atoms, provided at least one of $R_1$ and $R_2$ is a polar group containing an ether bond.

4. The EL polymer of claim 3, wherein at least one of the $R_1$ and $R_2$ contains 2 to 5 oxygen atoms forming an ether bond on every two carbons.

5. The EL polymer of claim 3, wherein the $R_1$ and $R_2$ are at positions 3' and 6', respectively.

6. The EL polymer of claim 3, wherein the $R_1$ and $R_2$ are at positions 1' and 6', respectively.

7. The EL polymer of claim 3, wherein at least one of the $R_1$ and $R_2$ is 3,6-dioxaheptyloxy or 3,6,9-trioxadecyloxy.

8. An electroluminescence element comprising:
   a cathode;
   an anode; and
   a light-emitting layer interposed between the cathode and the anode and containing the EL polymer as claimed in one of claims 3 and 4 though 7.

* * * * *